United States Patent [19]

Dlugos et al.

[11] 4,009,436
[45] Feb. 22, 1977

[54] LATCH STROBE GENERATOR CIRCUIT

[75] Inventors: Daniel F. Dlugos, Huntingdon; Flavio M. Manduley, Seymour, both of Conn.

[73] Assignee: Pitney-Bowes, Inc., Stamford, Conn.

[22] Filed: Dec. 15, 1975

[21] Appl. No.: 640,488

[52] U.S. Cl. ................ 324/73 R; 340/174 WA
[51] Int. Cl.² ............. G01R 15/12; G11C 11/02
[58] Field of Search ........ 324/73 R, 73 AT, 73 PC; 315/377; 340/174 WA

[56] References Cited
UNITED STATES PATENTS

| | | | |
|---|---|---|---|
| 3,076,120 | 1/1963 | Matthews et al. | 315/377 X |
| 3,501,754 | 3/1970 | Davie | 340/174 WA |
| 3,641,519 | 2/1972 | Ashley | 340/174 RC |
| 3,648,098 | 3/1972 | Talbert | 315/377 X |
| 3,859,556 | 1/1975 | Schumann | 315/24 |
| 3,870,953 | 3/1975 | Boatman et al. | 324/73 R |

Primary Examiner—R. V. Rolinec
Assistant Examiner—Vincent J. Sunderdick
Attorney, Agent, or Firm—William D. Soltow, Jr.; Albert W. Scribner; Robert S. Salzman

[57] ABSTRACT

A delayed latch strobe generator for a display on a monitor used to service digital logic systems wherein time-based or event-based latch strobes are generated. A device on the monitor can be pre-set by a user to select the interval between the system latch strobe and the delayed latch strobe. When the normal latch strobe occurs, a binary counter is enabled. This counter is then incremented by system clock pulses. An exclusive-NOR comparator continually compares the counter contents with the setting of the user-controlled device. A match, which indicates the interval has elapsed, results in the generation of a delayed latch strobe which is applied to the display.

8 Claims, 4 Drawing Figures

LOGIC BUFFER    DELAY SELECT SWITCHES

LATCH STROBE GENERATOR CIRCUIT

BACKGROUND OF THE INVENTION

The present invention relates to logic monitors and more particularly to a delayed latch strobe generator which may be used in such monitors.

Among the techniques which have been developed for monitoring the operation of digital logic circuits, the most basic technique is to simply check voltages one test point at a time. Since digital information is often processed in parallel, the circuit being monitored may have to be cycled through its operating sequence a number of times by an operator to monitor all of the points required to establish the value of parallel-presented digital information.

Permanent and portable monitors have also been used for displaying the status of particular logic circuits. Such monitors are special purpose units; i.e., units which may be used only with a particular set of logic circuits. Since special purpose monitors must be newly designed each time the digital logic is altered, such monitors are relatively costly.

To overcome the disadvantages associated with the prior art monitors, a general purpose digital logic monitor was invented. This monitor is described in detail in the U.S. application Ser. No. 640487 filed Dec. 15, 1975 and assigned to the assignee of the present invention.

The monitor disclosed therein is a hand-held unit which may be electrically connected to a number of test points in the circuit being serviced through a ribbon cable. The unit has a visual numeric display showing the value of signals on those test points. The monitor includes means for allowing an operator to generate auxiliary clock signals which step a circuit being serviced through its operating sequence. The monitor also includes means for generating a latch strobe so that the data appearing on the numeric display can be fixed at the discretion of the user.

Where the digital logic system is part of a control for an electromechanical device, such as an automatic mailing machine, normal latch strobes may be generated either on a time basis or upon the occurrence of readily detected events; e.g., the movement of a letter past a photosensitive detector. However, the user may be interested in monitoring data at other times. Heretofore, the user guessed when the right time was at hand and manually generated a latch strobe to freeze the numeric display. Clearly, this approach does not allow a user to consistently and accurately obtain the desired information.

SUMMARY OF THE INVENTION

To permit a user greater control over the display of numeric data, a delayed latch strobe generator permits the freezing of data either upon the occurrence of a normal latch strobe or after a user-selected delay.

The generator includes means for generating a set of signals representing the current time in a time-controlled sequence. The generator further includes a user-controlled delay select means for establishing a set of signals representing the time in the sequence at which the display is to be frozen. A comparator circuit compares the outputs of the first generating means with the outputs of the user-controlled delay select means. When a match is detected, indicating the point of time has been reached at which the display is to be frozen, the comparator produces the delayed latch strobe.

DESCRIPTION OF THE DRAWINGS

While the specification concludes with claims particularly pointing out and distinctly claiming that which is regarded as the present invention, details and further advantages of a preferred embodiment of the invention may be more readily ascertained from the following detailed description when read in conjunction with the accompanying drawings wherein:

DESCRIPTION OF THE SPECIFIC EMBODIMENTS

Figure 1:
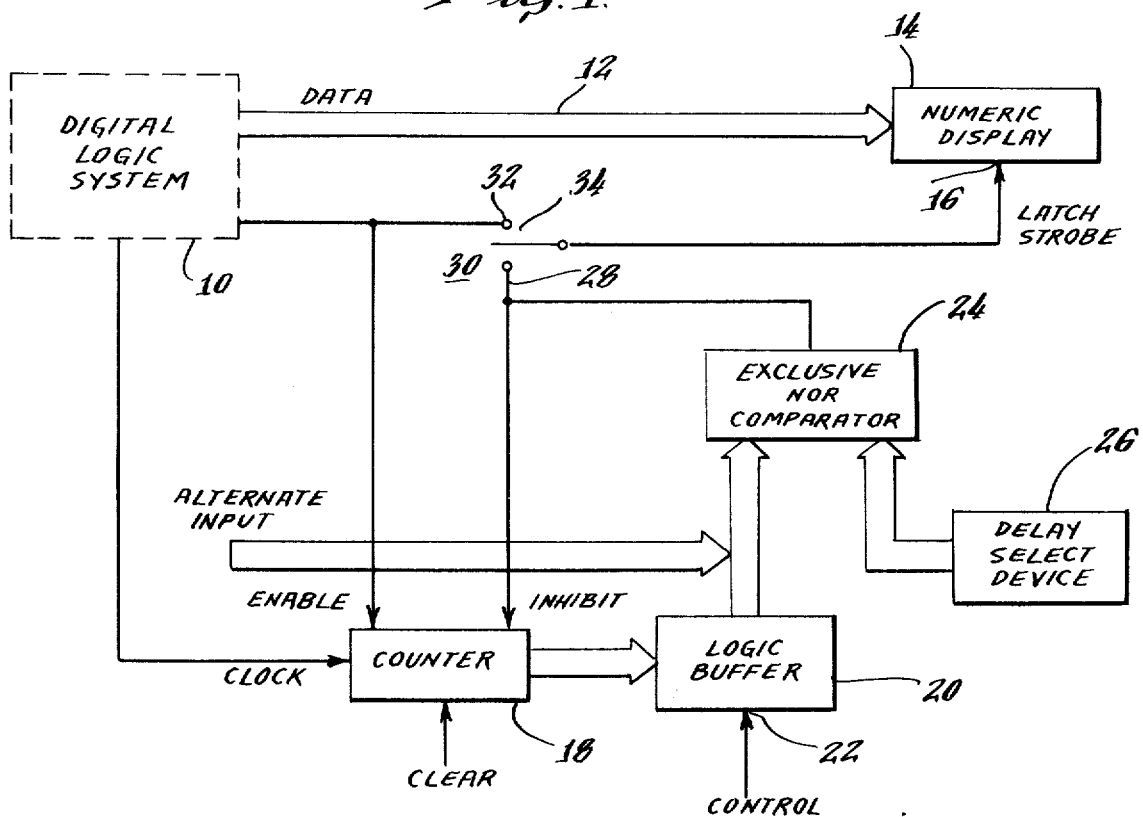
FIG. 1 is a block diagram of a delayed latch strobe generator constructed in accordance with the present invention.

In FIG. 1, a digital logic system to be monitored is shown only as a block 10 having dotted outlines. This indicates the details of the digital logic system are not significant. The invention can be used in servicing any digital logic system that (1) generates clock signals or other time-related signals, (2) presents data on a number of test points simultaneously, and (3) generates latch strobes at predetermined times or upon the occurrence of predetermined events; e.g., the movement of a letter or article past a photosensitive detector.

The data appearing at the test points being monitored is preferably presented in parallel. Parallel data flow is represented by a double-lined arrow, such as arrow 12 which represents the flow of data signals from the digital logic system 10 to a numeric display device 14, which may be a conventional, commercially available unit. One example of such a device is a type TIL 308 Numeric Display With Logic available from Texas Instruments, Inc. of Dallas, Texas. This particular device is a solid-state, visible display including a seven-segment L.E.D. display in which individual segments are selectively energized to display 0–9 numeric characters plus a limited number of symbols and alphabetical characters. The device includes a latch strobe input 16. When the signal on latch strobe input 16 goes high, the displayed data is fixed or frozen at the then current values. Changes in incoming data do not alter the display until the latch strobe input returns to a low level.

Latch strobes are typically generated upon the occurrence of a known event in the operation of the digital logic system. In a mailing machine a latch strobe might be generated when a letter breaks a photocell beam as it approaches a scale mechanism, a postal meter station, etc. Latch strobes may also be time-based; that is, may occur at known counts of a program counter which controls the overall operation of a digital logic system.

The present invention permits latch strobes generated within a digital logic system 10 to be applied either immediately or after a delay, a latch strobe input 16 or device 14. When applying a delayed strobe, the length of the delay is controlled by the user.

A simple two-position switch 30 is employed to switch the circuitry between these two modes of operation. When the latch strobe generated within a digital logic system 10 is to be applied without delay to latch strobe input 16 of numeric display 14, a movable member 34 is brought into position against a contact 32 to complete a signal path from digital logic system 10 through contact 32 and movable member 34 to input 16.

When the latch strobe input is to be delayed, the movable member 34 is switched to its other position at contact 28, the output from the delayed latch strobe generator. Under these conditions, the latch strobe generated within digital logic system 10 is applied to an enabling input of a previously inactive binary counter 18. Once enabled, counter 18 will begin to count clock pulses provided by digital logic system 10. The counter 18 may be a commercially available unit such as a type 8281 four-bit binary counter available from Signetics Corporation of Menlo Park, Cal., or a Type 74177 binary counter available from Texas Instruments, Inc. of Dallas, Tex.

The counter 18, in addition to the enable and clock inputs, includes an inhibit input which halts counter operation. The inhibiting signal is the delayed latch strobe itself. The counter 18 may be cleared through a clear input by an operator using an appropriate switch.

The output signal appearing on each stage of the counter 18 is appled in parallel with output signals from the other stages to a logic buffer 20. Depending on the level of the signal at its control input 22, the counter output signals are either passed through to parallel buffer outputs, or are blocked while high impedances are presented on each of the buffer outputs. The parallel outputs from logic buffer 20 are applied to an exclusive-NOR comparator circuit 24 having a second set of inputs from operator-controlled delay select device 26.

The delay select device 26 is pre-set by the user to reflect the time interval between the occurrence of the latch strobe signal generated within digital logic system 10, and the desired occurrence of the delayed latch strobe signal.

In a preferred embodiment of the invention, the output of delay select device 26, like the output from binary counter 18, takes the form of parallel binary signals. The particular mechanism employed as delay select device 26 is not critical. A bank of parallel, two-position switches might be used. Alternatively, decimal-to-binary converting switches might be used, although such switches are more expensive than binary or two-position switches.

Exclusive NOR comparator circuit 24 has a single output connected both to the contact 28 of switch 30, and to the inhibit input to the counter 18.

When the output binary signals from counter 18 are being transmitted through logic buffer 20, exclusive NOR comparator circuit 24 continually compares the current binary value in counter 18 with the binary value pre-set into delay select device 26. When a match is detected, indicating that the desired number of clock pulses have occurred, the output of the exclusive NOR comparator circuit 24 changes. The level change is transmitted through contact 28 and movable member 24 of switch 30, to the latch strobe input 16 of numeric display device 14.

Figure 2:
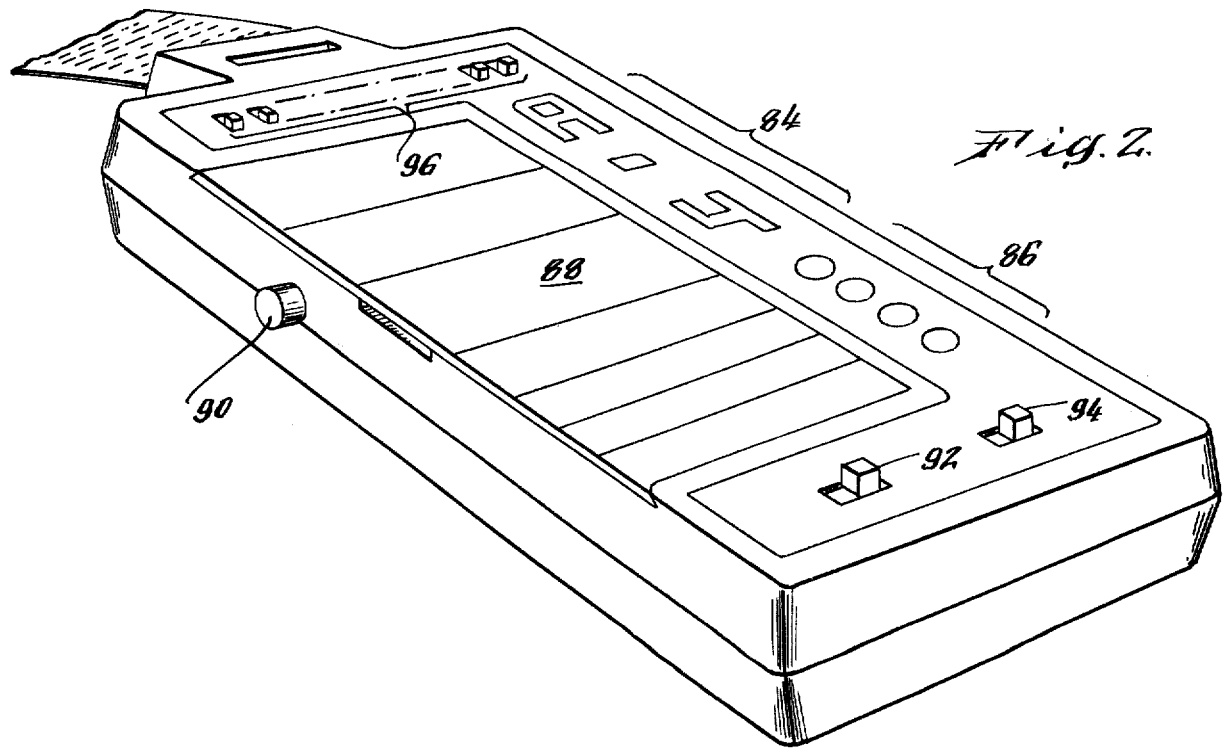
FIG. 2 is a perspective view of a portable monitor into which the circuit of FIG. 1 might be incorporated.

The delayed latch strobe generator circuit described above would preferably be employed in a portable monitor of the type shown in FIG. 2. The monitor includes a numeric display array 84 and, preferably, a number of light emitting diodes 86 that indicate the binary status of selected test points. A removable card 88 might identify the particular test points being monitored.

Other features of the monitor might include a pushbutton switch 90 for generating auxiliary clock pulses, a first slider switch 92 for permitting a user to select either of two sets of inputs to be applied through multiplexers to the display apparatus, a second slider switch 94 which would correspond to the switch 30 shown in FIG. 1, and an array of binary switches 96 constituting the delay select device 26.

Figure 3:
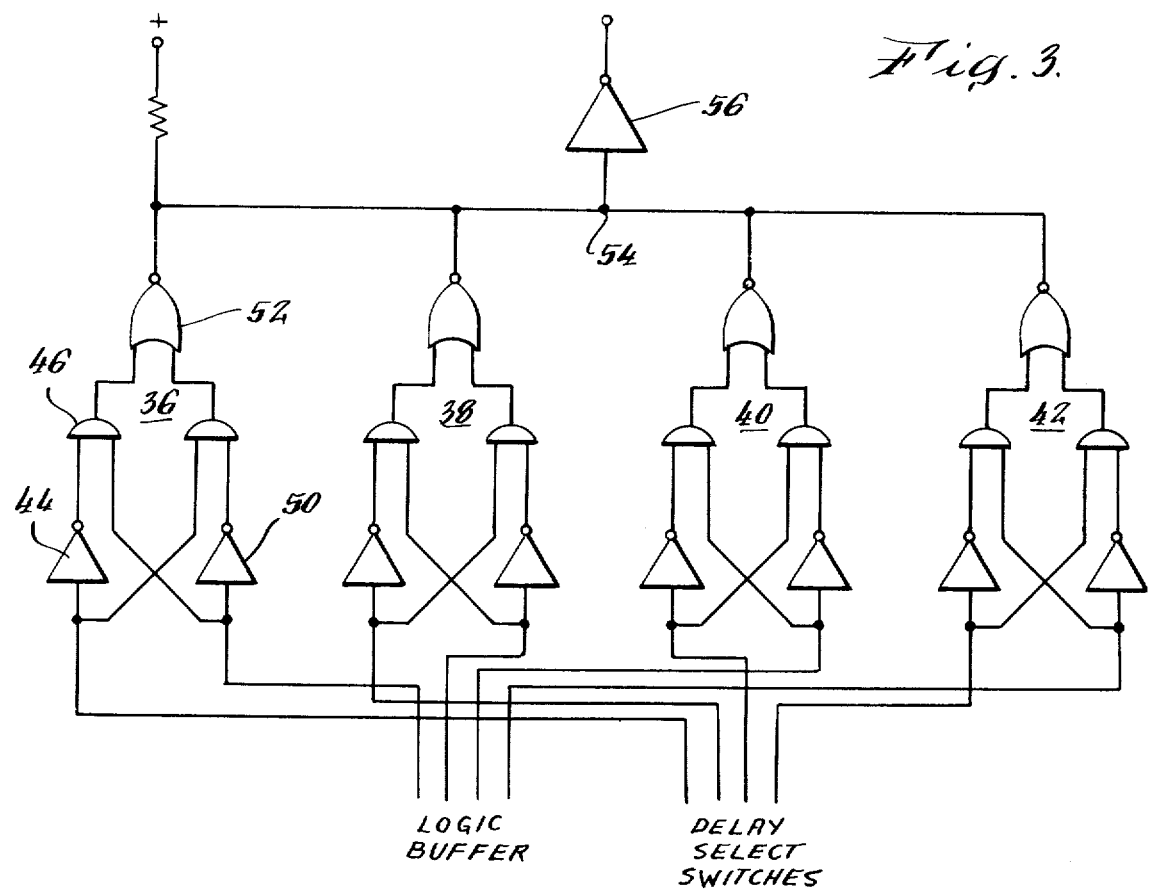
FIG. 3 is a logic diagram representing a portion of the exclusive-NOR comparator shown in block diagram form in FIG. 1.

The exclusive-NOR comparator circuit 24 may be made up from commercially available devices such as a Type 8242 Quad Exclusive-NOR circuit available from Signetics Corporation of Menlo Park, Cal. A number of such devices would be connected in parallel. The operation of one exclusive-NOR circuit is discussed with reference to FIG. 3 to better explain the invention. Although only four exclusive-NOR circuits 36, 38, 40, 42 are shown, it should be understood that 16 or more of such circuits would be employed in a practical embodiment of the invention. The actual number employed would depend on the number of stages in counter 18. The number of counter stages, in turn, would depend on the number of clock pulses which would occur during the maximum delay period, since the counter would have to have the capacity to count this number of pulses. Since each of the circuits operates independently of other circuits in the array, only the operation of circuit 36 will be described in detail.

Circuit 36 includes a first inverter 44 having its input connected to one output from delay select device 26. For purposes of illustration assume this input to represent the binary value of the most significant bit (MSB) of the binary number pre-set in delay select device 26. The inverted selected MSB signal is applied to one input to an AND gate 46, while the normal selected MSB signal is applied to one input of another AND gate 48. The circuit 36 includes a second inverter 50 having an input terminal connected to the most significant bit of the counter 18, through the logic buffer 20. The inverted counter MSB signal is applied to AND gate 48, while the normal signal is applied as a second input to AND gate 46.

If the selected MSB signal and the counter MSB signal do not match, (that is, one is a binary 1 while the other is a binary 0) the output of one of the AND gates 46 and 48 will be a binary 1, while the output of the other AND gate will be a binary 0. A NOR gate 52 responds to dissimilar input signals with a binary 1 output signal.

When the two MSB signals are at the same level, both of the AND gates 46 and 48 are disabled with a binary 1 at one input and a binary 0 at the other input. Consequently, both AND gates generate binary 0 output signals, which cause the output of NOR gate 52 to drop to a low level at a common output connection 54.

The description above applies to the operation of each of the exclusive-NOR circuits in the array. Each circuit has, of course, inputs from corresponding binary stages of counter 18 and delay select device 26.

When all of the exclusive-NOR circuits in comparator circuit 24 produce binary 0 signals, the binary contents of the counter 18 identically match the binary contents of delay select device 26. Under these conditions, the voltage on the common output 54 falls from a binary 1 to a binary 0 level. The voltage on the common output 54 is applied to an inverter 56, which converts the match-indicating binary 0 signal to a binary 1 signal required to freeze the numeric display 14.

Figure 4:
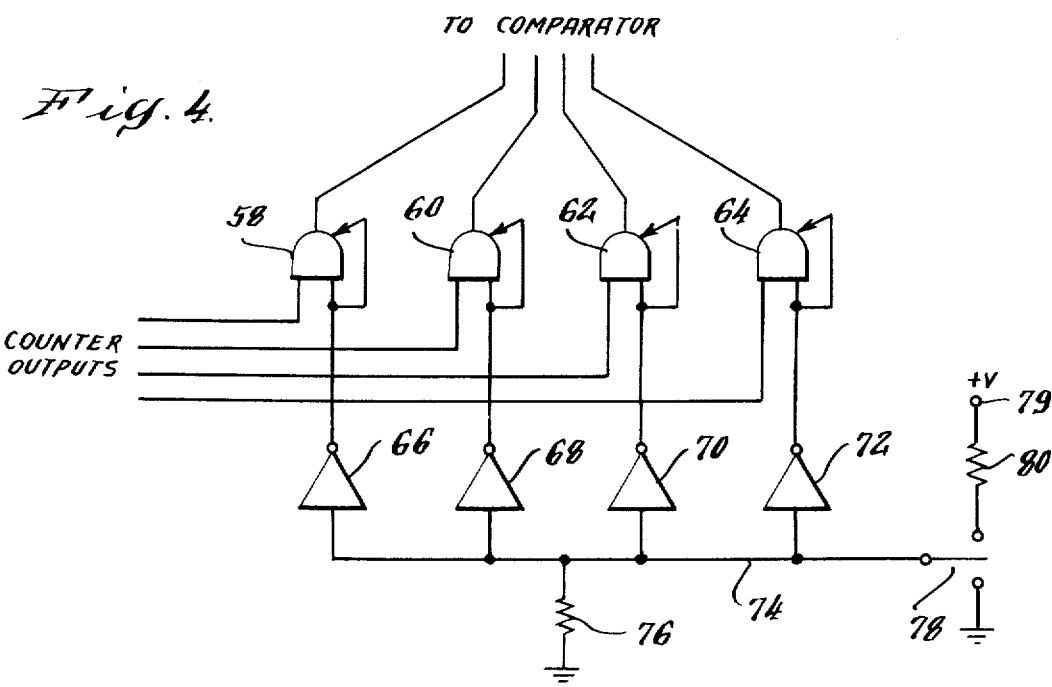
FIG. 4 is a logic diagram showing a part of the logic buffer shown in diagram form in FIG. 1.

The logic buffer 20 may be a commecially avialable buffer such as a Type DM7094/DM8094 TRI-STATE quad buffer available from National Semiconductor Corporation. The logic diagram of such a buffer circuit is shown in FIG. 4. Four buffer elements 58, 60, 62 and 64 are shown. Again, a practical embodiment of the invention would probably have 16 or more buffers connected in parallel. Each buffer has one input from a different stage of counter 18. A second input to each of the buffer elements is provided through a common control circuit including inverters 66, 68, 70 and 72. The common input to inverters 66, 68, 70 and 72 may, by means of a switch 78, be connected to ground, or to a voltage divider including a voltage source 79, a first resistor 80, and a second resistor 76.

When the buffer elements 58, 60, 62 and 64 are to transmit the binary signals appearing on the counter outputs, the switch 78 is thrown to a position in which a low level input is supplied to each of the inverter amplifiers 66, 68, 70 and 72. The resulting binary 1 signals at the outputs of the inverters allow the counter output signals to be transmitted through the buffer elements.

When the buffer elements are to block the counter output signals, the switch 78 is thrown to the other position. The higher level signal on the common control input 74 is inverted by the inverters, to cause binary 0 signals to be applied to each of the buffer elements 58, 60, 62 and 64. Under these conditions, the output of each buffer element exhibits an extremely high, fixed impedance which effectively provides an open circuit to the counter output signals.

The logic buffer 20 permits the inputs to exclusive-NOR comparator circuit 24 to be tied directly to the outputs from an alternate type of control system, such as a microprocessor. The multi-bit words which control operations within such processor would be presented in parallel over a bus 82 directly to the inputs of the exclusive-NOR comparator circuit 24. The non-functioning counter 18 is prevented from loading the microprocessor during operation in this alternate mode, by the high output impedance of each element in logic buffer 20.

While there has been described what is considered to be a preferred embodiment of the present invention, variations and modifications will occur to those skilled in the art once they become familiar with the invention. Therefore, it is intended that the appended claims shall be construed to cover all such variations and modifications as fall within the true spirit and scope of the invention.

What is claimed is:
1. In a monitor having a data display means with a latch strobe input for freezing the display, said monitor being used for servicing digital logic systems which manipulate data in a time-controlled sequence, an improved latch strobe generator comprising:
 a. means for generating a set of signals representing the current time in the time-controlled sequence,
 b. an operator-controlled selection means for establishing a set of signals representing the time in the sequence at which the display is to be frozen, each said set of signals having a unique format representing a different time; and
 c. a comparator circuit connected to said selection means and said signal generating means to generate the latch strobe when the compared sets of signals are complementary

2. In a monitor having a data display means with a latch strobe input for freezing the display, said monitor being used for servicing digital logic signals, an improved latch strobe generator comprising:
 a. a counter having an enable input to which latch strobes generated within the digital logic system may be applied, and a clock signal input over which clock signals from the digital logic system may be applied to increment the counter after enablement by the system-generated latch strobe;
 b. an operator-controlled delay select means for establishing a set of output signals representing a desired delay following a system-generated latch strobe, before a delayed latch strobe is to be generated; and
 c. a comparator circuit connected to said delay select means and to said counter for generating the delayed latch strobe when the compared outputs are complementary.

3. The improved latch strobe generator as recited in claim 2, wherein said counter further includes an inhibit input connected to the output of said comparator circuit, whereby further incrementing is inhibited upon generation of the delayed latch strobe.

4. The improved latch strobe generator as recited in claim 2, wherein said comparator circuit comprises a plurality of exclusive-NOR gates, each of said gates having a first input from one stage of said counter and a second input from a corresponding output of said operator-controlled delay select means.

5. The improved latch strobe generator as recited in claim 4, wherein said plurality of exclusive-NOR gates have a common output connection.

6. The improved latch strobe generator as recited in claim 2, further including a two position switch having a first contact electrically connected to a latch strobe output from the digital logic system, a second contact electrically connected to an output of said comparator circuit and a movable member for connecting a latch strobe input of the data display either to the system latch strobe output or to the comparator output at the option of a user.

7. The improved latch strobe generator as recited in claim 5, further including a two position switch having a first contact electrically connected to a latch strobe output from the digital logic system, a second contact electrically connected to an output of said comparator circuit and a movable member for connecting a latch strobe input of the data display either to system latch strobe output or to the comparator output at the option of a user.

8. The improved latch strobe generator as recited in claim 2, further including a logic buffer interposed between an output of said counter and said comparator, said buffer having a control input and being adapted to pass applied binary signals at one level of a binary control signal, and to exhibit a high output impedance at another level of the binary control signal.

* * * * *